(12) United States Patent
Kim et al.

(10) Patent No.: US 8,913,450 B2
(45) Date of Patent: Dec. 16, 2014

(54) MEMORY CELL ARRAY WITH RESERVED SECTOR FOR STORING CONFIGURATION INFORMATION

(71) Applicant: QUALCOMM Incorporated, San Diego, CA (US)

(72) Inventors: Jung Pill Kim, San Diego, CA (US); Taehyun Kim, San Diego, CA (US); Sungryul Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 232 days.

(21) Appl. No.: 13/680,361

(22) Filed: Nov. 19, 2012

(65) Prior Publication Data

US 2014/0140162 A1    May 22, 2014

(51) Int. Cl.
| | |
|---|---|
| *G11C 7/00* | (2006.01) |
| *G11C 7/20* | (2006.01) |
| *G11C 16/20* | (2006.01) |
| *G11C 29/00* | (2006.01) |
| *G11C 29/44* | (2006.01) |

(52) U.S. Cl.
CPC ........ *G11C 7/20* (2013.01); *G11C 16/20* (2013.01); *G11C 29/789* (2013.01); *G11C 29/44* (2013.01); *G11C 2029/4402* (2013.01)
USPC ...................... 365/200; 365/189.14

(58) Field of Classification Search
USPC ................. 365/230.01, 200, 189.14
See application file for complete search history.

(56) References Cited

U.S. PATENT DOCUMENTS

| | | | |
|---|---|---|---|
| 5,808,944 A * | 9/1998 | Yoshitake et al. | 365/200 |
| 7,177,977 B2 * | 2/2007 | Chen et al. | 711/103 |
| 8,015,438 B2 | 9/2011 | Bruennert et al. | |
| 2001/0049174 A1 | 12/2001 | Pitts et al. | |
| 2006/0041711 A1 | 2/2006 | Miura et al. | |
| 2007/0253254 A1 | 11/2007 | Morooka et al. | |
| 2008/0016391 A1 | 1/2008 | Ossimitz | |
| 2009/0129186 A1 | 5/2009 | Schnell et al. | |
| 2009/0235040 A1 | 9/2009 | Chilumula et al. | |
| 2011/0016352 A1 | 1/2011 | Ong et al. | |
| 2011/0066878 A1 | 3/2011 | Hosono et al. | |
| 2012/0002480 A1 | 1/2012 | Yun | |
| 2012/0173921 A1 | 7/2012 | Wuu et al. | |

OTHER PUBLICATIONS

International Search Report and Written Opinion—PCT/US2013/070817—ISA/EPO—Aug. 26, 2014.

* cited by examiner

*Primary Examiner* — Son Dinh
(74) *Attorney, Agent, or Firm* — Sam Talpalatsky; Nicholas J. Pauley; Joseph Agusta

(57) ABSTRACT

A memory device is provided including a cell array and a volatile storage device. The cell array may include a plurality of word lines, a plurality of bit lines, wherein a selection of a word line and bit line defines a memory cell address, and a non-volatile reserved word line for storing configuration information for the cell array. The volatile storage device is coupled to the cell array. The configuration information from the non-volatile reserved word line is copied to the volatile storage device upon power-up or initialization of the memory device.

37 Claims, 10 Drawing Sheets

MEMORY CELL ARRAY WITH RESERVED SECTOR FOR STORING CONFIGURATION INFORMATION

BACKGROUND

1. Field

Various features relate to memory devices and, in particular, a memory cell array with reserved sectors for storing configuration information, including failed address information, for the memory cell array.

2. Background

FIG. 1 illustrates a typical cell array for a memory device. In one example, the memory device may be a non-volatile memory device that includes one or more cell arrays. The cell array 102 may comprise a first cell array 101a and/or second cell array 101b that are accessible from a single decoder 103 or separate decoders. The cell array 102 may comprise one or more word lines (WL) 104 and one or more bit lines 105 crossing/intersecting the word lines 104, and electrically rewritable and non-volatile memory cells 107 disposed at the crossings between the word lines 104 and bit lines 105 and capable of storing a plurality of bits (e.g., one bit per bit cell). The decoder 103 may serve to decode an input address and select a corresponding appropriate word line and bit line (e.g., column and row). That is, the selection of a word line and bit line combination permits storage of a bit at a particular address. The cell array 102 may also comprise a redundancy system to "repair" failed word lines by using one or more redundant word lines (RWL) 108 accessed via a word line redundancy module 106. Upon detection of a failed word line 109, the address(es) corresponding to that failed word line 109 are mapped, assigned, and/or redirected to a redundant word line 108. The redundancy system may also include an internal or external fuse block 110 (e.g., one-time programmable or non-volatile storage) that stores failed address information for the cell array 102 and an exclusive (EX) OR module 112. The EXOR module 112 may compare an input address 116 to the failed address(es) in the fuse block 110. Upon the occurrence of a read/write operation to the cell array 102, the input address 116 is provided to the EXOR module 112. If an input address 116 is found in the fuse block 110, then the write/read operation is routed to the redundant word line (RWL) 108 in the cell array 102.

FIG. 2 illustrates that the typical cell array 102 for the memory device may also use fuse blocks 202a, 202b, and 202c for other purposes. For proper memory device operation, certain information is needed, such as a chip identifier, timing trimming, and/or voltage trimming. Such information is often stored in fuse blocks inside and/or outside of the memory device. In addition to failed address information (e.g., tow/column and/or IO repair), additional fuse blocks 202a, 202b, 202c may serve to store: (a) chip identifier (ID) information, (b) timing and/or voltage/current options, and/or (c) other functional options.

The use of internal or external fuse blocks with memory devices has several problems. For instance, internal fuse blocks (e.g., on the same semiconductor die as the cell array) increase the chip size since a fuse block is relatively large. Using external fuse blocks on the same substrate or package) to store failed address information requires a signal bus from the outside fuse block to the cell array.

Consequently, there is a need for an alternative to using fuse blocks with cell arrays in memory devices.

SUMMARY

According to a first feature, a memory device is provided comprising: a cell array and a volatile memory storage coupled to the cell array. The cell array may include: (a) a plurality of word lines, (b) a plurality of bit lines, wherein a selection of a word line and bit line defines a memory cell address, (c) a non-volatile reserved word line for storing configuration information for the cell array, and/or (d) a redundant word line mapped to replace a failed word line from the plurality of word lines. The volatile storage device (e.g., one or more volatile flip flops) may be configuration information from the non-volatile reserved word line is copied to the volatile storage device upon power-up or initialization of the memory device. In some implementations, the volatile storage device may be integrated as part of the cell array (e.g., within the same semiconductor die or package).

In one example, the non-volatile reserved word line may store information related to at least one of: (a) a failed word line address from the plurality of word lines, (b) a failed memory cell address from the plurality of word lines and bit lines, and/or (c) a mapping or redirection between a failed word line from the plurality of word lines and a redundant word line within the cell array.

In one example, the configuration information for the cell array may include at least one of: (a) a chip identifier for the cell array, (b) timing trimming information for the cell array, and/or (c) voltage trimming information for the cell array.

In one implementation, the non-volatile reserved word line may be part of a reserved sector within the cell array that is separately accessible from the plurality of word lines. The non-volatile reserved word line may provide: (a) read-only non-volatile storage and/or (b) one-time programmable storage. The cell array may be a non-volatile storage device (e.g., the plurality of word lines are non-volatile storage).

The memory device may also include a control circuit coupled to the cell array, and configured to: (a) read the configuration information from the non-volatile reserved word line upon a power up event or a transfer command, (b) store the configuration information into the volatile storage device, and/or (c) use the configuration information to configure access to the cell array.

A second feature provides a method for storing configuration information for a memory cell array within a reserved sector of the memory cell array. A cell array may be formed including: (a) a plurality of word lines, (b) a plurality of bit lines, wherein a selection of a word line and bit line defines a memory cell address, and/or (c) a non-volatile reserved word line. The non-volatile reserved word line may be part of a reserved sector within the cell array that is separately accessible from the plurality of word lines. Configuration information for the cell array may be stored (e.g., during manufacturing or upon testing of the memory cell array) in the non-volatile reserved word line. The configuration information for the cell array may include at least one of: (a) a chip identifier for the cell array, (b) timing trimming information for the cell array, and/or (c) voltage trimming information for the cell array.

A volatile storage device may also be formed and coupled to the cell array. The configuration information from the non-volatile reserved word line may be copied to the volatile storage device upon power-up or initialization of the memory device. The plurality of word lines may he tested during a manufacturing stage to ascertain one or more failed addresses within the word lines. As a result, failed addresses may be stored as part of the configuration information in the non-volatile reserved word line.

A redundant word line may also be formed as part of the cell array, where the redundant word line is mapped to replace a failed word line from the plurality of word lines. The non-volatile reserved word line may store information related to at least one of: (a) a failed word line address from the plurality of word lines, (b) a failed memory cell address from the plurality of word lines and bit lines, and/or (c) a mapping or redirection between a failed word line from the plurality of word lines and a redundant word line within the cell array.

Another feature provides a memory device, comprising a cell array, a volatile memory storage, and a control circuit. The cell array may include: (a) a plurality of word lines, (b) a plurality of bit lines, wherein a selection of a word line and bit line defines a memory cell address, and/or (c) a non-volatile reserved word line containing configuration information for the cell array. The volatile storage device may be coupled to the cell array. The control circuit may be coupled to the cell array, and may be configured to: (a) read the configuration information from the non-volatile reserved word line upon a power up event or a transfer command, (b) store the configuration information in the volatile storage device, and/or (c) use the configuration information to configure access to the cell array.

The cell array may further include a redundant word line mapped to replace a failed word line from the plurality of word lines. The non-volatile reserved word line may store information related to at least one of: (a) a failed word line address from the plurality of word lines, (b) a failed memory cell address from the plurality of word lines and bit lines, and/or (c) a mapping or redirection between a failed word line from the plurality of word lines and a redundant word line within the cell array. In one implementation, the cell array may be a non-volatile storage device, e.g., non-volatile reserved word line may provide read-only non-volatile storage or one-time programmable storage.

Yet another feature provides a method for using configuration information for a memory cell array within a reserved sector of the memory cell array. Configuration information may be read from a non-volatile reserved word line within the memory cell array upon a power up event or a transfer command. The configuration information may be stored in a volatile storage device. The configuration information may then be used to configure access to the memory cell array. The non-volatile reserved word line may store information related to at least one of: (a) a failed word line address from the plurality of word lines, (b) a failed memory cell address from the plurality of word lines and bit lines, and/or (c) a mapping or redirection between a failed word line from the plurality of word lines and a redundant word line within the cell array.

Using the configuration information to configure access to the memory cell array may include: (a) receiving an input address for a read or write operation on the cell array, (b) determining whether the input address corresponds to a failed word line or failed memory cell, and/or (c) redirecting the read or write operation to a redundant word line within the memory cell array if the input address corresponds to a failed word line or failed memory cell. In one example, the configuration information for the cell array may include at least one of: (a) a chip identifier for the cell array, (b) timing trimming information for the cell array, and/or (c) voltage trimming information for the cell array.

DRAWINGS

Various features, nature and advantages may become apparent from the detailed description set forth below when taken in conjunction with the drawings in which like reference characters identify correspondingly throughout.

FTC. 7 is a block diagram illustrating one example of a semiconductor memory device comprising a plurality of memory cell arrays that are configured with reserved sectors of non-volatile storage.

Figure 8:
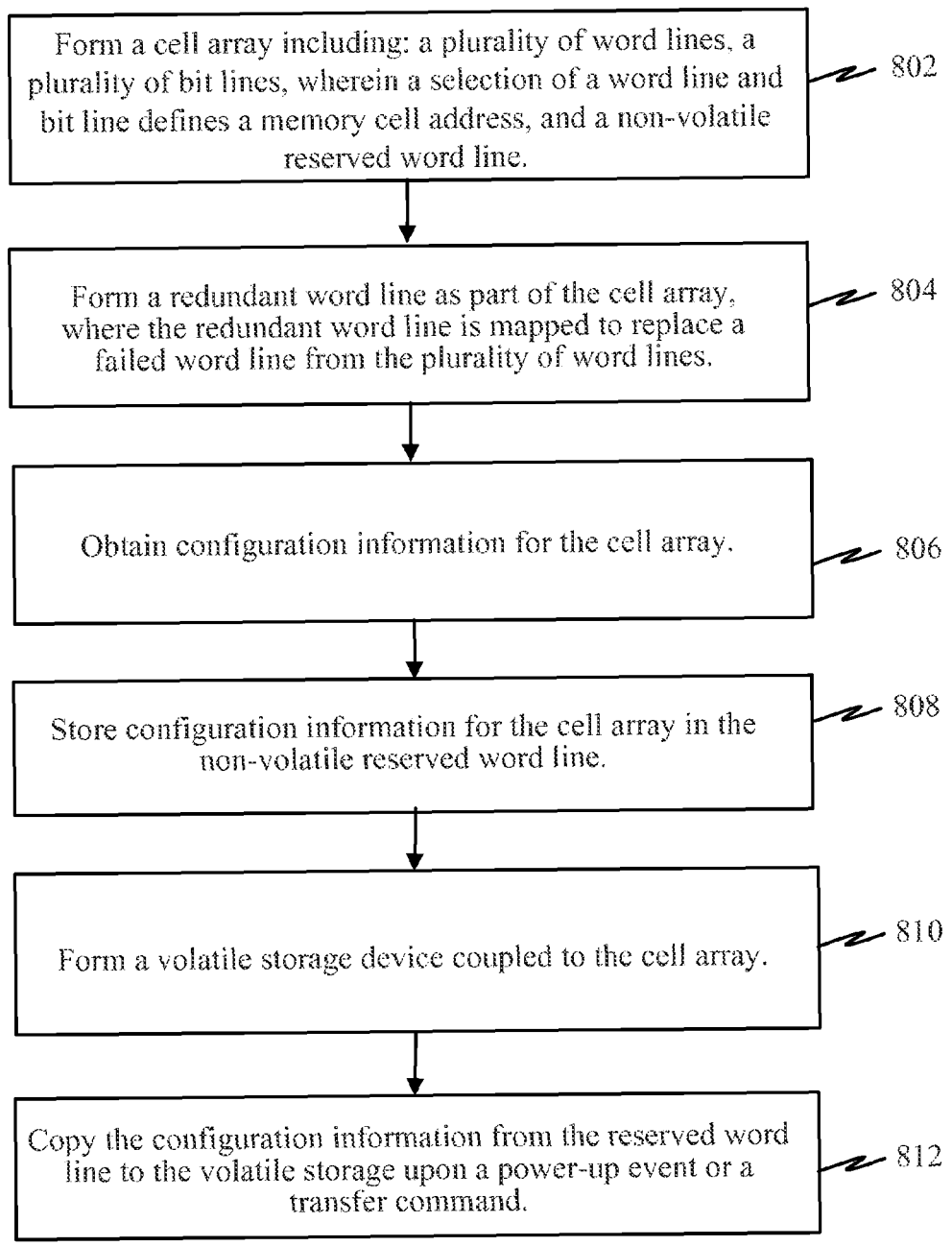

FIG. 8 illustrates a method for manufacturing a memory device including a plurality of memory cell arrays that include reserved sectors of non-volatile storage for storing configuration information for the memory cell arrays.

Figure 9:
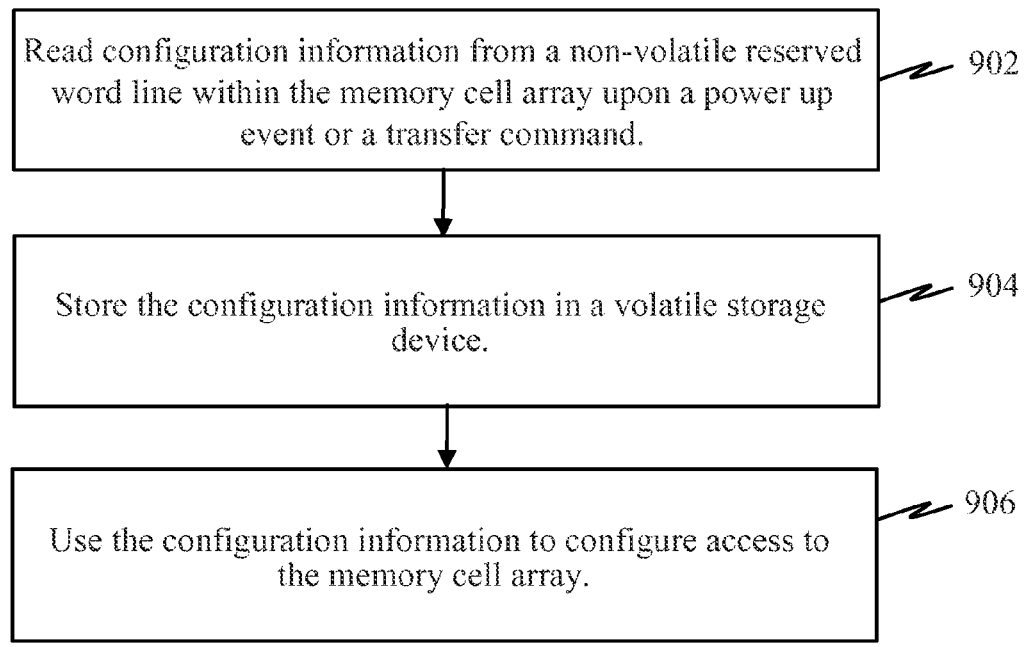

FIG. 9 illustrates a method for using configuration information for a memory cell array within a reserved sector of the memory cell array.

Figure 10:
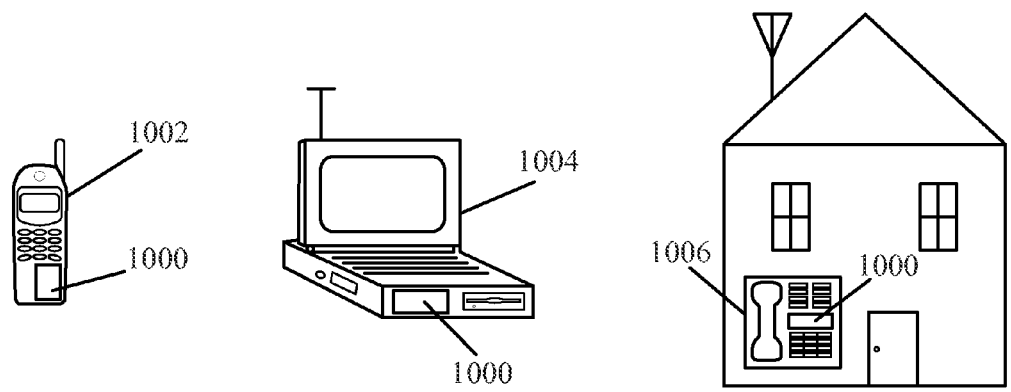

FIG. 10 illustrates various electronic devices that may include a memory device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

At least one feature pertains to a non-volatile memory device comprising memory cell arrays having reserved sectors of one or more word lines that are used to store configuration information for the cell array. In one example, the configuration information may be stored in a reserved sector of the cell array during a manufacturing stage of the non-volatile memory device and/or a post manufacturing test stage. For instance, upon manufacturing of the cell array and/or non-volatile memory device, a data sector of the cell array may be tested to identify the presence of any defective word lines. If any defective word lines are identified, the address(es) for the failed word line(s) are stored in the of the reserved sector. Additionally, the cell array may include one or more redundant word lines that are used to repair/replace the failed word lines. Consequently, corresponding repair/replacement word line addresses may also be stored in the reserved sector. Additionally, one or more chip identifiers, corresponding to the cell array, may also be stored in the reserved sector. Other cell array specific configuration information, such as timing trimming and/or voltage trimming may also be stored in this reserved sector. In some implementations, the word lines in the reserved sector may be one-time programmable (OTP) and/or may not be written to during normal operation of the non-volatile memory device.

The one or more word lines in the reserved sector are read upon power-up or initialization of the memory device and the configuration information previously stored therein is copied to an external volatile storage (e.g., flip-flop devices) from where it may be used to configure the memory device and/or cell array.

Exemplary Memory Cell Array with Integrated Reserved Storage

Figure 1:
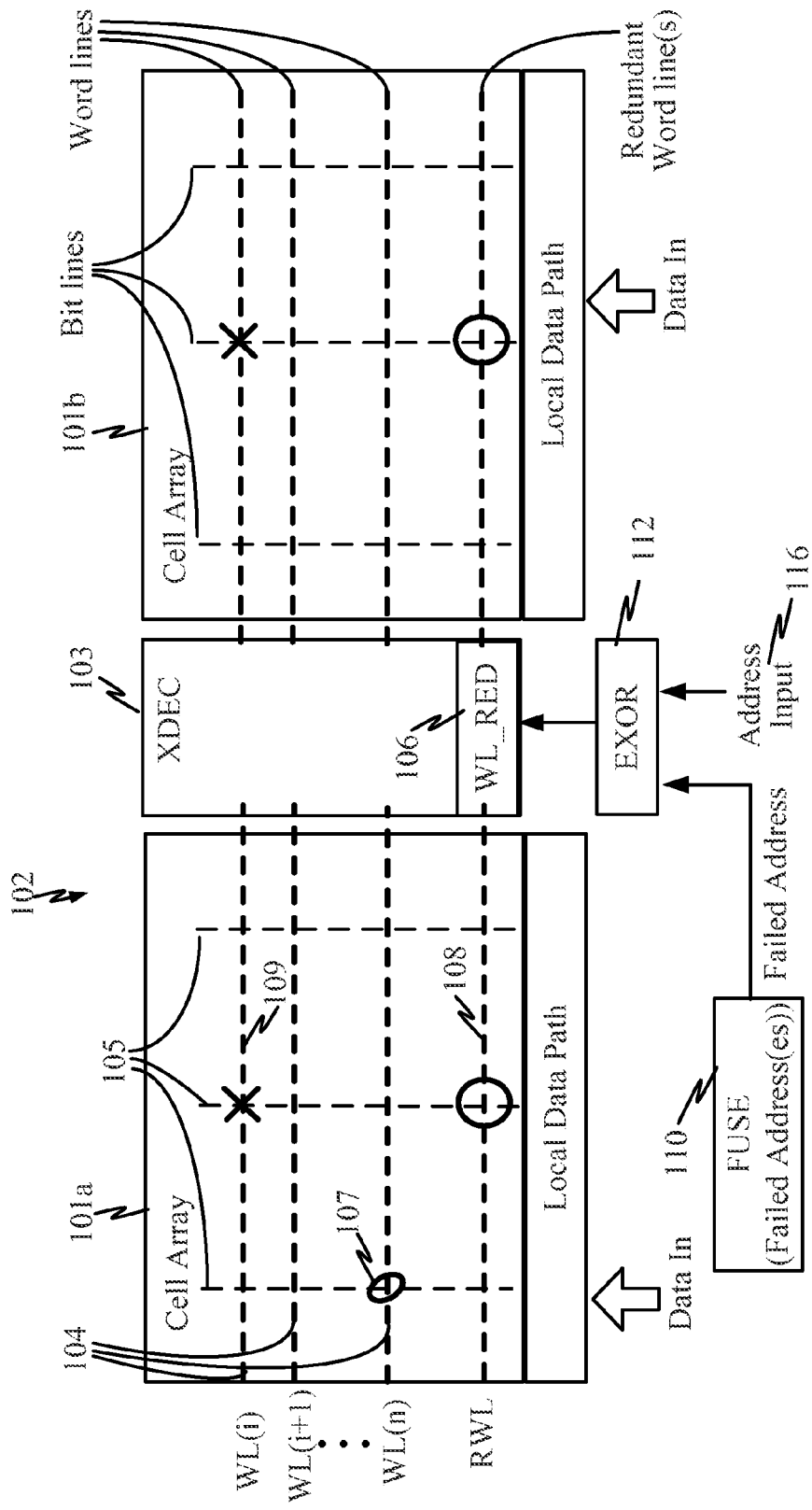
FIG. 1 illustrates a typical cell array for a memory device.
Figure 2:
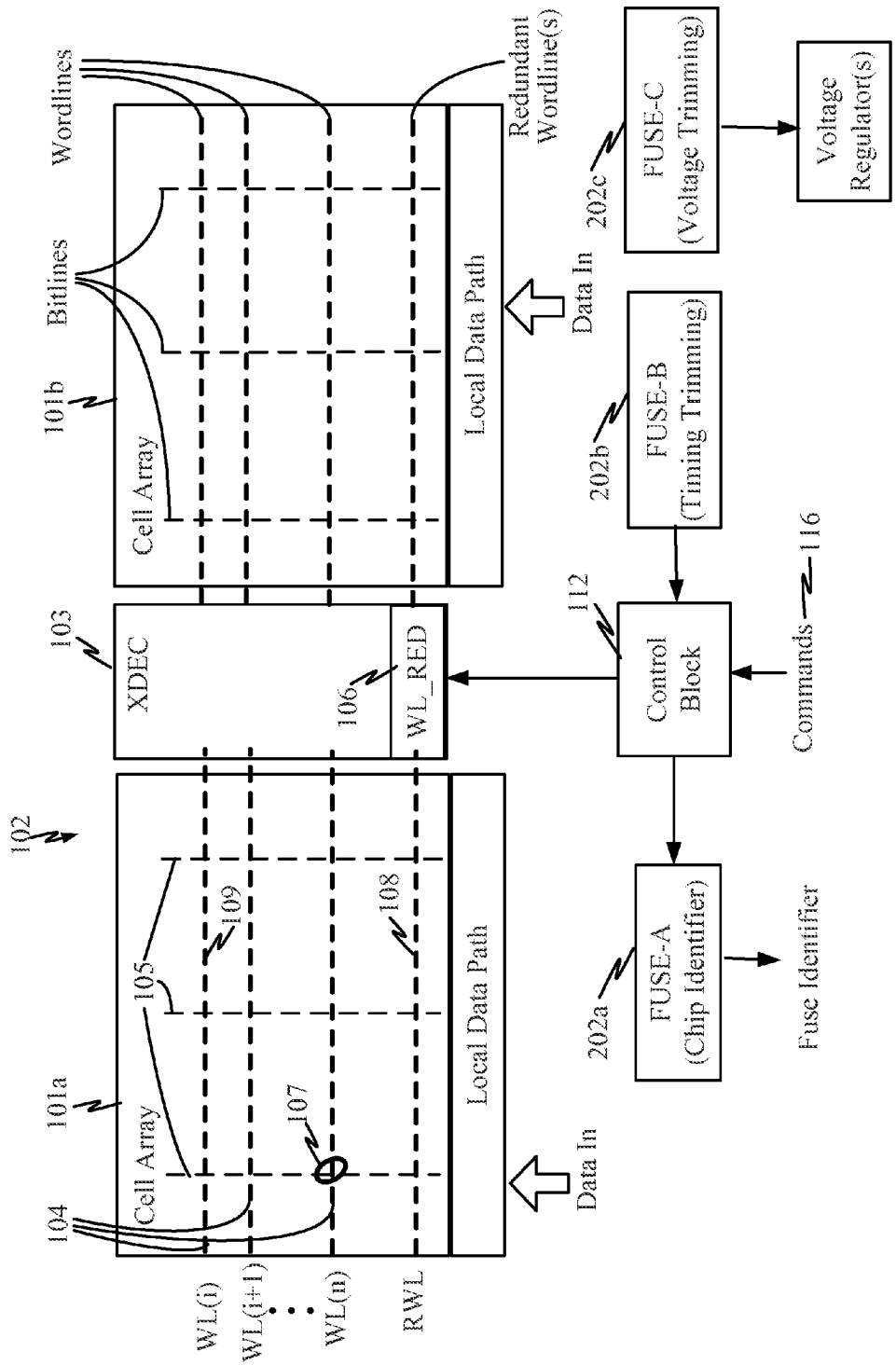
FIG. 2 illustrates that the typical cell array for the memory device may also use fuse blocks for other purposes.
Figure 3:
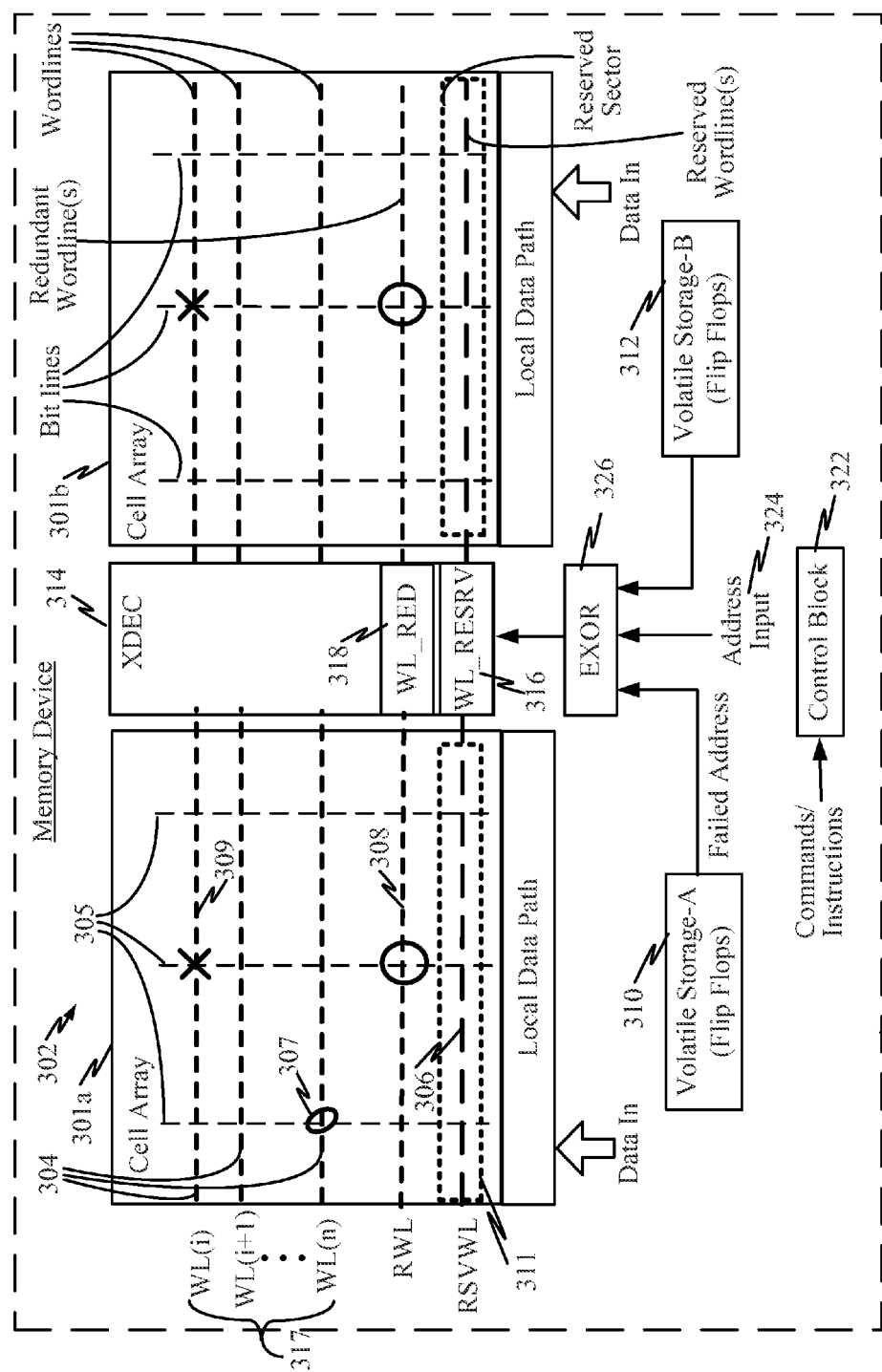
FIG. 3 illustrates a memory device having one or more cell arrays that include a reserved sector with one or more reserved and/or purpose-specific word lines.

FIG. 3 illustrates a memory device 300 having one or more cell arrays 302 that include a reserved sector with one or more reserved and/or purpose-specific word lines. The cell array 302 may comprise a first cell array 301a and/or second cell array 301b that are accessible from a single decoder 314 or separate decoders. The cell array 302 may comprise one or more word lines (WL) 304 and one or more bit lines 305 crossing/intersecting the word lines 304, and electrically rewritable and non-volatile memory cells 307 disposed at the crossings/intersection between the word lines 304 and bit lines 305 and capable of storing a plurality of bits (e.g., one bit per bit cell). A decoder 314 may serve to decode an input address and select a corresponding appropriate word line and bit line (e.g., column and row). That is, the selection of a word line and bit line combination permits storage of a bit at a particular address. The cell array 302 may also comprise a redundancy system to "repair" failed word lines by using one or more redundant word lines (RWL) 308 accessed via a word line redundancy module/circuit 318. Upon detection of a failed word line 309, the address(es) corresponding to that failed word line 309 are mapped, assigned, and/or redirected to a redundant word line 308.

One or more reserved sectors 311 have been added to the cell array 302, where each reserved sector 311 may include one or more reserved/purpose-specific word lines 306. The cell array 302 may include a word line reserve module/circuit 316 which serves to access the reserved word line(s) (RSVWL) 306 in the one or more reserved sectors 311. The reserved/purpose-specific word line(s) 306 may serve to store information that would otherwise have been stored on fuse blocks (e.g., failed/repair address information, chip ID, timing/voltage/current trimming bits/information). The fuse blocks used in prior art approaches have been replaced with volatile storage devices 310 and 312 (e.g., flip flops) which take up a smaller area on a semiconductor die, substrate, or package. The cell array 302 and volatile storage devices 310 and 312 may be integrated into the same semiconductor die, semiconductor device or chip than the cell array 302.

In one example, the memory device 300 may be a non-volatile memory device. Configuration information specific to the cell array 302 may be stored in a reserved sector 311 of the cell array 302 during a manufacturing stage of the memory device and/or a post manufacturing test stage. For instance, upon manufacturing of the one or more cell arrays 302 and/or memory device 300, a data sector 317 of the cell array 302 may be tested to identify the presence of any defective word lines 309. If any defective word lines are identified, the address(es) for the failed word line(s) 309 are stored in the of the reserved sector 311. Additionally, the cell array 302 may include one or more redundant word lines 308 that are used to repair/replace the failed word lines 309. Consequently, corresponding repair/replacement word line addresses may also be stored by the reserved word line(s) 306 in the reserved sector 311. Additionally, one or more chip identifiers, corresponding to the cell array, may also be stored in the reserved sector. Other cell array specific configuration information, such as timing trimming and/or voltage trimming may also be stored in this reserved sector 311. In some implementations, the reserved word lines 306 in the reserved sector 311 may be one-time programmable (OTP) and/or may not be written to during normal operation of the non-volatile memory device.

During reserved sector 311 access (e.g., transfer/read/write mode), after power-up of the memory device 300, some or all of information stored in the reserved/purpose-specific word line(s) (RSVWL) 306 may be transferred/copied into the volatile storage devices 310 and 312. The volatile storage devices 310 and/or 312 may be accessed (e.g., by a memory controller or control block 322, etc.) to read the information therein and used to configure the one or more cell arrays 302. Such "normal operation" may occur once the memory device 300 has been placed, installed, or affixed onto a circuit board and/or electrically coupled to a processing circuit after a manufacturing and/or testing stage(s).

In one example, upon receiving an input address 324 for the purpose of accessing a corresponding word line (e.g., to perform a read or write operation), an exclusive OR (EXOR) module/circuit 326 may check the input address 324 against one or more failed address (e.g., in volatile storage device 310) to determine if the input address has been mapped or redirected to a different address (e.g., on a redundant word line). If so, the word line redundancy module/circuit 318 is enabled and the operation (e.g., read/write) is directed to a redundancy word line 308 that has been mapped or assigned to replace the failed address (e.g., failed word line 309).

Figure 4:
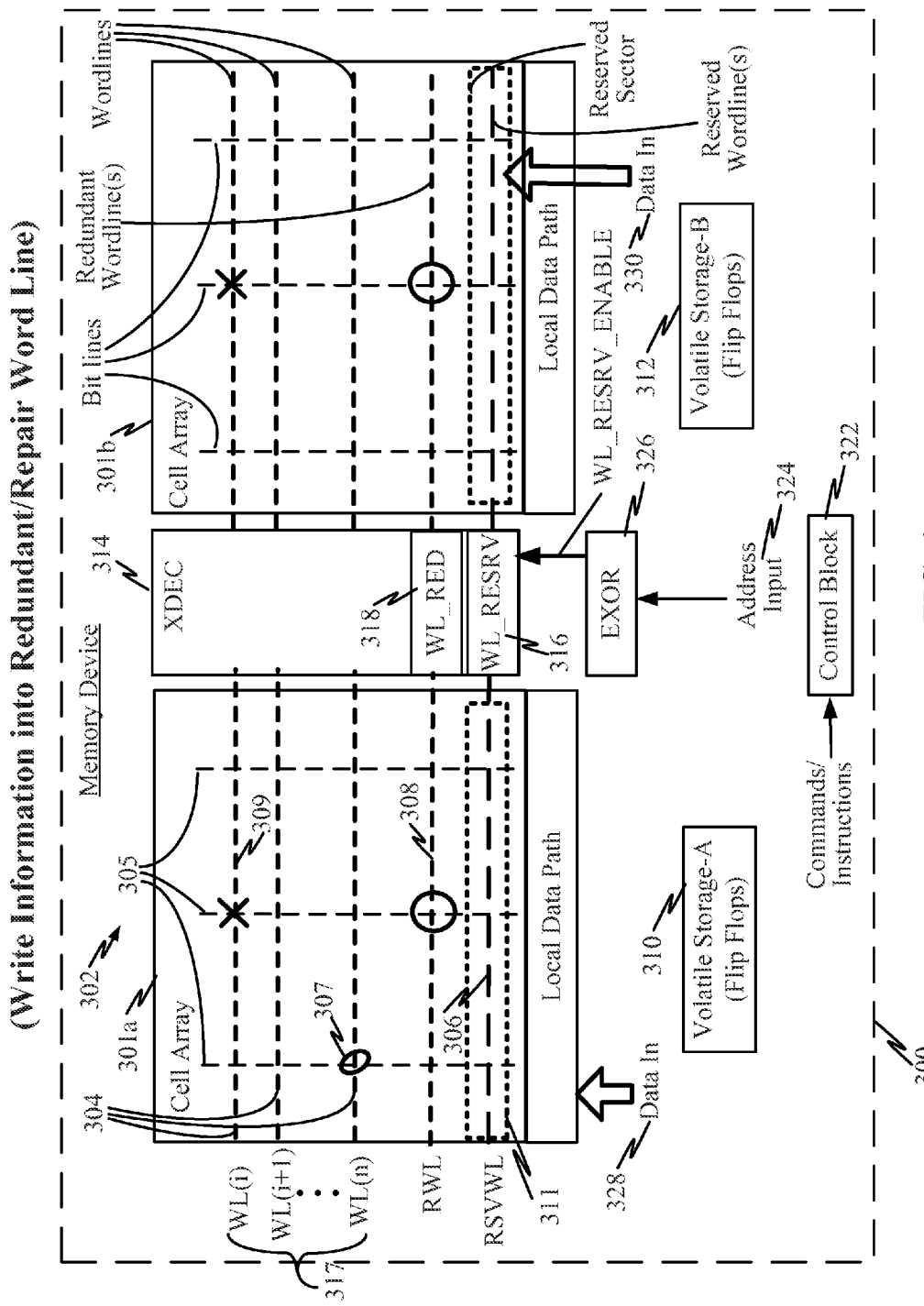
FIG. 4 illustrates the storage of information into the reserved sector.
Figure 5:
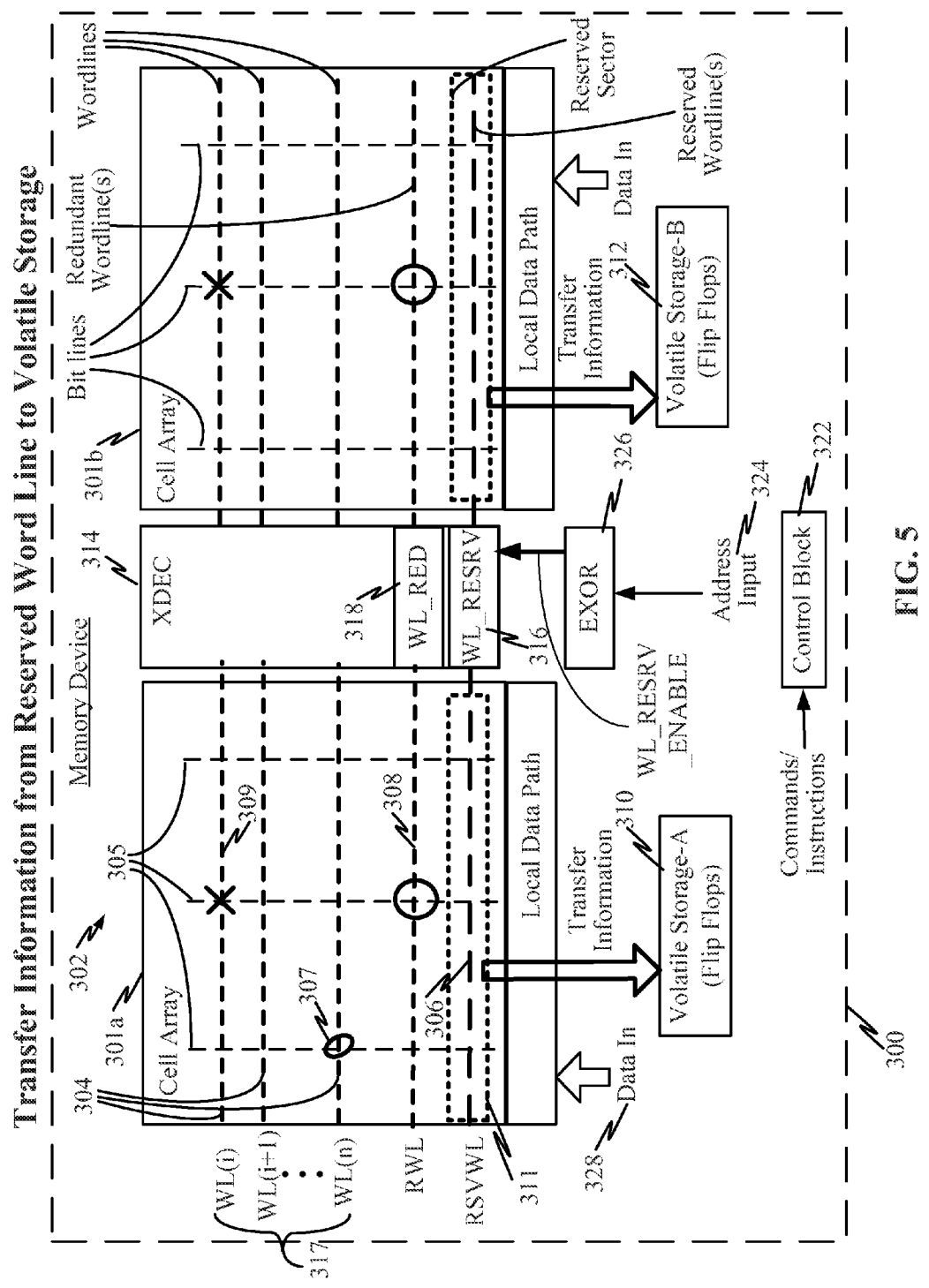
FIG. 5 illustrates the process of transferring information from the purpose-specific sector in the cell array into a volatile storage device.
Figure 6:
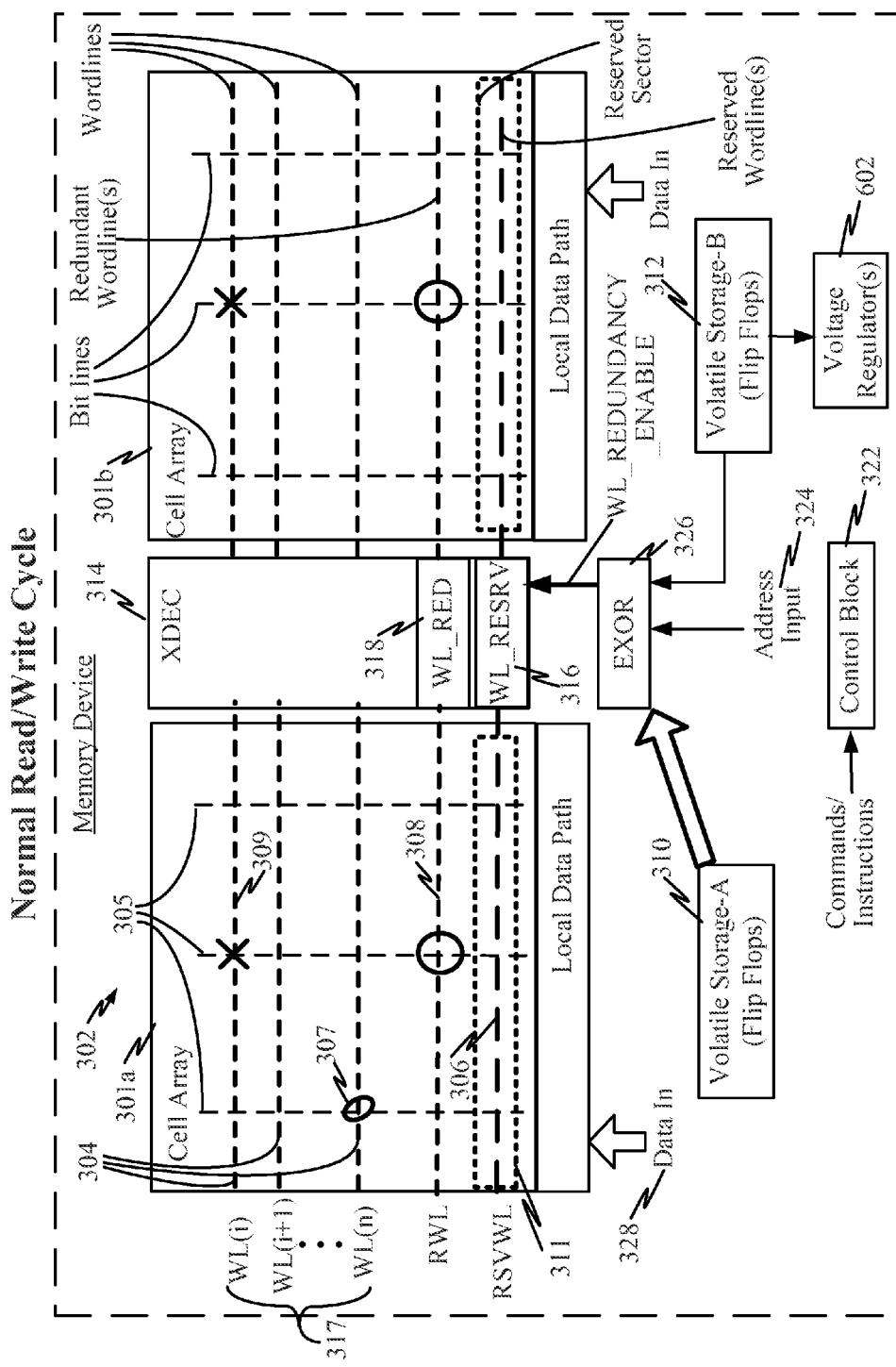
FIG. 6 illustrates normal read/write operation using the information copied into the volatile storage device.

FIGS. 4-6 illustrate the process of using a reserved sector in a cell array in conjunction with an external volatile storage for operations of the cell array.

FIG. 4 illustrates the storage of information into the reserved sector 311. First, configuration information (e.g., failed/repair addresses, chip ID, timing/voltage trimming, etc.) for the cell array 302 is obtained. For example, this may be obtained by testing the word lines in the data sector 317, and/or specified during a manufacturing/testing stage (e.g., prior to installation of the memory device 300 on a printed circuit board). Access to the reserved word line 306 of the reserved sector 311 may then be enabled via the word line reserve module/circuit 316. The information may then be written into the reserved/purpose-specific word line 306 through a normal write cycle via the data input path(s) 328 and/or 330.

FIG. 5 illustrates the process of transferring information from the purpose-specific sector in the cell array into a volatile storage device. Upon receipt of an external command (e.g., after power cycling the memory device), the word line repair/reserve module 316 activates the repair/reserved/purpose-specific word line 309 and the information stored therein is transferred to the volatile storage device(s) 310 and 312 (e.g., via local data paths). This cycle may be performed, for example, whenever a new power-up sequence or execution of a transfer command occurs. Such transfer command may be sent, for example, via the control block 322 to cause the word line reserve module/circuit 316 to be enabled and then the information in the reserved word line(s) 306 is copied/transferred to the volatile storage device(s) 310 and/or 312.

FIG. 6 illustrates normal read/write operation using the information copied into the volatile storage device. In one example, the volatile storage device(s) 310 and 312 is being used to store failed/repair address information (in 310), chip ID information, timing trimming bits for the cell array (in 312), and voltage trimming bits for the cell array (in 312). For instance, the repair/replacement address(es) in the volatile storage device A 310 may be compared with input address(es) 324 to make a decision on whether such address (from a word line 309 in the data sector 317) has been mapped/assigned to a redundant word line 308. If a match is found, then the word line redundancy module/circuit 318 is enabled and the corresponding redundant word line 308 is accessed for the corresponding data read/write operation.

Similarly, timing trimming bits for the cell array 302 that may be copied into the volatile storage device B 312 may then be used to configure access to the cell array 302. Likewise, voltage trimming bits for the cell array 302 that may be copied into the volatile storage device B 312 may then be used to configure one or more voltage regulators 602 for the cell array 302.

In some implementations, memory type implemented by the cell array 302 may be non-volatile (e.g., flash memory, ferroelectric RAM, one-time programmable storage, read-only memory). In one example, the word lines 304 in the data sector 317 (and the redundant word lines 308) may implement volatile memory storage while the reserved sector 311 (reserved word lines 306) may implement non-volatile memory storage. In another example, the word lines 304 in the data sector 317 (and the redundant word lines 308) and the reserved sector 311 (e.g. reserved word lines 306) may all implement non-volatile memory storage.

In the case where the memory device 300 is a flash memory device, for example, data may be read/written from/to the word lines 304 (and/or redundant word lines 306) of the cell array 302 during normal operation. However, the configuration information in the reserved sector 311 (word lines 306) may be read-only so that it cannot be overwritten. The word line reserve module/circuit 316 may serve to restrict access to the reserved sector 311 such that it may restrict or prevent write operations into the reserved word line(s) 306.

In the case where the memory device 300 is a one-time programmable storage device and/or read-only memory device, data may be written into the word lines 304 during a manufacturing process or pre-distribution process and further write operations to the cell array 302 may be disabled. In such situation, failure of a word line 304 may be detected during such manufacturing process or pre-distribution process and a redundant word line 308 is used to replace such failed word line. In another implementation, rather than replacing the whole word line 304 with a redundant word line 306, the specific failed address (e.g., column and row) within the word line 304 may be identified and memory address and a corresponding redundant address is used within the redundant word line 306. Such failed address and/or repair address mapping information may then be stored in the reserved sector 311.

In one example, the memory device 300 comprises one or more cell arrays 302 that may be tested during manufacturing and failed/defective word lines (or addresses) may be identified. At that point, a mapping between a failed word line 309 (or failed address) and a redundant word line 308 (repair address) and such information is stored in the purpose-specific sector 308 (in the one or more repair word lines 309).

Figure 7:
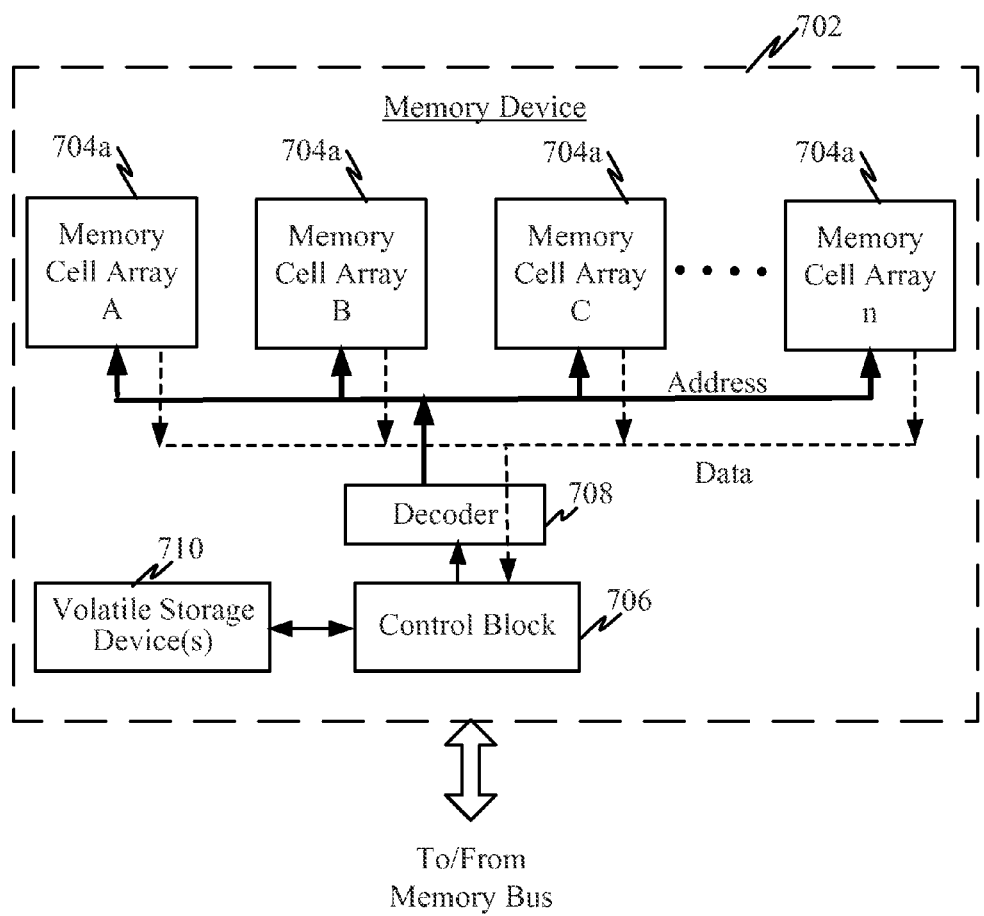

FIG. 7 is a block diagram illustrating one example of a semiconductor memory device 702 comprising a plurality of memory cell arrays 704a-d that are configured with reserved sectors of non-volatile storage. The memory device 702 may include a control block 706 that manages communications to/from the plurality of memory cell arrays 704a-d. A decoder 708 serves to identify an address within the cell arrays 704a-d to write data to and/or read data from such address. Each cell array 704a-d may be configured to operate as illustrated in FIGS. 3-6, and may include a reserved sector (non-volatile or one-time writable memory) for storing configuration information for the cell array. This configuration information is copied to the volatile storage device(s) 710 upon power-up of the memory device 702 or upon receipt of a transfer command. From the volatile storage device(s) 710, the configuration information may be used for replacing failed addresses in the cell array, as a chip identifier, and/or voltage/timing trimming for the cell arrays 704a-d.

FIG. 8 illustrates a method for manufacturing a memory device including a plurality of memory cell arrays that include reserved sectors of non-volatile storage for storing configuration information for the memory cell arrays. A cell array is formed including: a plurality of word lines, a plurality of bit lines, wherein a selection of a word line and bit line defines a memory cell address, and a non-volatile reserved word line 802. A redundant word line may also be formed as part of the cell array, where the redundant word line is mapped to replace a failed word line from the plurality of word lines 804. Configuration information for the cell array, such as a chip identifier, failed address(es), repair address(es), timing/voltage trimming, is obtained 806. For instance, the plurality of word lines may be tested during a manufacturing stage to ascertain one or more failed addresses within the word lines. The configuration information for the cell array (e.g., failed addresses, etc.) may then be stored in the non-volatile reserved word line 808. A volatile storage device coupled to the cell array may also be formed 810. The configuration information may be copied or transferred from the reserved word line to the volatile storage upon a power-up event or a transfer command 812.

FIG. 9 illustrates a method for using configuration information for a memory cell array within a reserved sector of the memory cell array. Configuration information is read from a non-volatile reserved word line within the memory cell array upon a power up event or a transfer command 902. The configuration information is then stored in a volatile storage device 904. Here, a The configuration information may then be used to configure access to the memory cell array 906.

In one example, using the configuration information to configure access to the memory cell array includes: (a) receiving an input address for a read or write operation on the cell array, (b) determining whether the input address corresponds to a failed word line or failed memory cell, and/or (c) redirecting the read or write operation to a redundant word line within the memory cell array if the input address corresponds to a failed word line or failed memory cell.

FIG. 10 illustrates various electronic devices that may include a memory device 1000. The memory device 1000 may be any one of the memory devices 300, 702, described above with respect to FIGS. 3, 4, 5, 6, 7, 8, and/or 9. For example, a mobile telephone 1002, a laptop computer 1004, and a fixed location terminal 1006 may include the memory device 1000. The devices 1002, 1004, 1006 illustrated in FIG. 10 are merely exemplary. Other electronic devices may also feature the memory device 1000 including, but not limited to, hand-held personal communication systems (PCS) units, portable data units such as personal data assistants, UPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 3, 4, 5, 6, 7, 8, 9 and/or 10 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs is may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The terms "machine readable medium" or "machine readable storage medium" include, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits (e.g., processing circuit), elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A memory device, comprising:
   a cell array including
      a plurality of word lines,
      a plurality of bit lines, wherein a selection of a word line and bit line defines a memory cell address, and
      a non-volatile reserved word line for storing configuration information for the cell array; and
   a volatile storage device coupled to the cell array, wherein the configuration information from the non-volatile reserved word line is copied to the volatile storage device upon power-up or initialization of the memory device.

2. The memory device of claim 1, wherein the cell array further includes
   a redundant word line mapped to replace a failed word line from the plurality of word lines.

3. The memory device of claim 1, wherein the non-volatile reserved word line stores information related to at least one of:
   a failed word line address from the plurality of word lines,
   a failed memory cell address from the plurality of word lines and bit lines, and/or
   a mapping or redirection between a failed word line from the plurality of word lines and a redundant word line within the cell array.

4. The memory device of claim 1, wherein the configuration information for the cell array includes at least one of:
a chip identifier for the cell array,
timing trimming information for the cell array, and
voltage trimming information for the cell array.

5. The memory device of claim 1, wherein the non-volatile reserved word line provides read-only non-volatile storage.

6. The memory device of claim 1, wherein the non-volatile reserved word line provides one-time programmable storage.

7. The memory device of claim 1, wherein the cell array is a non-volatile storage device.

8. The memory device of claim 1, wherein the plurality of word lines are non-volatile storage.

9. The memory device of claim 1, wherein the non-volatile reserved word line is part of a reserved sector within the cell array that is separately accessible from the plurality of word lines.

10. The memory device of claim 1, wherein the volatile storage device includes one or more volatile flip flops.

11. The memory device of claim 1, wherein the volatile storage device is integrated as part of the cell array.

12. The memory device of claim 1, wherein the cell array and volatile storage device are on the same semiconductor die or package.

13. The memory device of claim 1, further comprising:
a control circuit coupled to the cell array, the control circuit adapted to
read the configuration information from the non-volatile reserved word line upon a power up event or a transfer command,
store the configuration information into the volatile storage device, and
use the configuration information to configure access to the cell array.

14. A method for storing configuration information for a memory cell array within a reserved sector of the memory cell array, comprising:
forming a cell array including
a plurality of word lines,
a plurality of bit lines, wherein a selection of a word line and bit line defines a memory cell address, and
a non-volatile reserved word line;
storing configuration information for the cell array in the non-volatile reserved word line; and
forming a volatile storage device coupled to the cell array.

15. The method of claim 14, further comprising:
testing the plurality of word lines during a manufacturing stage to ascertain one or more failed addresses within the word lines; and
storing failed addresses as part of the configuration information in the non-volatile reserved word line.

16. The method of claim 14, wherein the configuration information from the non-volatile reserved word line is copied to the volatile storage device upon power-up or initialization of the memory device.

17. The method of claim 14, further comprising:
forming a redundant word line as part of the cell array, where the redundant word line is mapped to replace a failed word line from the plurality of word lines.

18. The method of claim 14, wherein the non-volatile reserved word line stores information related to at least one of:
a failed word line address from the plurality of word lines,
a failed memory cell address from the plurality of word lines and bit lines, and/or
a mapping or redirection between a failed word line from the plurality of word lines and a redundant word line within the cell array.

19. The method of claim 14, wherein the configuration information for the cell array includes at least one of:
a chip identifier for the cell array,
timing trimming information for the cell array, and
voltage trimming information for the cell array.

20. The method of claim 14, wherein the non-volatile reserved word line provides read-only non-volatile storage or one-time programmable storage.

21. The method of claim 14, wherein the plurality of word lines are non-volatile storage.

22. The method of claim 14, wherein the non-volatile reserved word line is part of a reserved sector within the cell array that is separately accessible from the plurality of word lines.

23. The method of claim 14, wherein the volatile storage device includes one or more volatile flip flops.

24. A memory device, comprising:
a cell array including
a plurality of word lines,
a plurality of bit lines, wherein a selection of a word line and bit line defines a memory cell address, and
a non-volatile reserved word line containing configuration information for the cell array;
a volatile storage device coupled to the cell array; and
a control circuit coupled to the cell array, the control circuit adapted to
read the configuration information from the non-volatile reserved word line upon a power up event or a transfer command,
store the configuration information in the volatile storage device,
use the configuration information to configure access to the cell array.

25. The memory device of claim 24, wherein the cell array further includes
a redundant word line mapped to replace a failed word line from the plurality of word lines.

26. The memory device of claim 24, wherein the non-volatile reserved word line stores information related to at least one of:
a failed word line address from the plurality of word lines,
a failed memory cell address from the plurality of word lines and bit lines, and/or
a mapping or redirection between a failed word line from the plurality of word lines and a redundant word line within the cell array.

27. The memory device of claim 24, wherein the non-volatile reserved word line provides read-only non-volatile storage or one-time programmable storage.

28. The memory device of claim 24, wherein the cell array is a non-volatile storage device.

29. A method for using configuration information for a memory cell array within reserved sector of the memory cell array, comprising:
reading a configuration information from a non-volatile reserved word line within the memory cell array upon a power up event or a transfer command;
storing the configuration information in a volatile storage device; and
using the configuration information to configure access to the memory cell array.

30. The method of claim 29, wherein the non-volatile reserved word line stores information related to at least one of:

a failed word line address from the plurality of word lines, a failed memory cell address from the plurality of word lines and bit lines, and/or a mapping or redirection between a failed word line from the plurality of word lines and a redundant word line within the cell array.

31. The method of claim 29, wherein using the configuration information configure access to the memory cell array includes receiving an input address for a read or write operation on the cell array;

determining whether the input address corresponds to a failed word line or failed memory cell; and redirecting the read or write operation to a redundant d line within the memory cell array if the input address corresponds to a failed word line or failed memory cell.

32. The method of claim 29, wherein the configuration information for the cell array includes at least one of:

a chip identifier for the cell array, timing trimming information for the cell array, and voltage trimming information for the cell array.

33. A memory device, comprising:

means for reading a configuration information from a non-volatile reserved word line within the memory cell array upon a power up event or a transfer command;

means for storing the configuration information in a volatile storage device; and means for using the configuration information to configure access to the memory cell array.

34. The memory device of claim 33, wherein the non-volatile reserved word line stores information related to at least one of:

a failed word line address from the plurality of word lines, a failed memory cell address from the plurality of word lines and bit lines, and/or a mapping or redirection between a failed word line from e plurality of word lines and a redundant word line within the cell array.

35. The memory device of claim 33, wherein using the configuration information to configure access to the memory cell array includes means for receiving an input address for a read or write operation on the cell array;

means for determining whether he input address corresponds to a failed word line or failed memory cell; and means for redirecting the read or write operation to a redundant word line within the memory cell array if the input address corresponds to a failed word line or failed memory cell.

36. A machine-readable storage medium comprising instructions for operating a memory device, which when executed by one or more processors causes the one or more processors to:

read a configuration information from a non-volatile reserved word line within the memory cell array upon a power up event or a transfer command;

store the configuration information in a volatile storage device; and use the configuration information to configure access to the memory cell array.

37. The machine-readable storage medium of claim 36, further comprising instructions for operating a memory device, which when executed by one or more processors causes the one or more processors to:

receive an input address for a read or write operation on the cell array;

determine whether the input address corresponds to a failed word line or failed memory cell; and redirect the read or write operation to a redundant word line within the memory cell array if the input address corresponds to a failed word line or failed memory cell.

* * * * *